(12) United States Patent
Imura

(10) Patent No.: US 7,057,340 B2
(45) Date of Patent: Jun. 6, 2006

(54) ORGANIC ELECTROLUMINESCENCE DISPLAY DEVICE

(75) Inventor: Hironori Imura, Tokyo (JP)

(73) Assignee: NEC Corporation, Tokyo (JP)

( * ) Notice: Subject to any disclaimer, the term of this patent is extended or adjusted under 35 U.S.C. 154(b) by 192 days.

(21) Appl. No.: 10/838,203

(22) Filed: May 5, 2004

(65) Prior Publication Data

US 2004/0227459 A1    Nov. 18, 2004

(30) Foreign Application Priority Data

May 15, 2003  (JP) .............................. 2003-136785

(51) Int. Cl.
*H01J 1/62* (2006.01)
(52) U.S. Cl. ...................................... 313/504; 313/506
(58) Field of Classification Search ................ 313/498, 313/504, 506, 509, 512
See application file for complete search history.

(56) References Cited

U.S. PATENT DOCUMENTS

| | | | | |
|---|---|---|---|---|
| 6,046,547 A | * | 4/2000 | Nishio et al. ............ | 315/169.3 |
| 6,958,490 B1 | * | 10/2005 | Okamoto et al. ............ | 257/40 |
| 6,967,435 B1 | * | 11/2005 | Park et al. .................. | 313/501 |

FOREIGN PATENT DOCUMENTS

| | | |
|---|---|---|
| JP | 2001-117509 | 4/2001 |
| JP | 2002-82633 | 3/2002 |

* cited by examiner

*Primary Examiner*—Vip Patel
(74) *Attorney, Agent, or Firm*—Young & Thompson

(57) ABSTRACT

An organic electroluminescence display device comprises a first substrate including a light emitting area comprising a first electrode, an organic electroluminescence layer and a second electrode stacked one over another and a second substrate including a connection layer for feeding a driving signal to the second electrode. The first substrate has a connection area in which a portion of the second electrode is off set vertically from the light emitting area and connected to the connection layer of the second substrate. The connection area does not overlie the light emitting area.

10 Claims, 11 Drawing Sheets

ORGANIC ELECTROLUMINESCENCE DISPLAY DEVICE

CROSS-REFERENCES TO RELATED APPLICATIONS

The disclosure of Japanese Patent Application No. JP2003-136785 filed on May 15, 2003 including the specification, drawings and abstract is incorporated herein by reference in its entirety.

BACKGROUND OF THE INVENTION

1. Field of the Invention

The present invention relates to an organic electroluminescence (hereinafter, referred to as an EL) display device, and particularly to an organic EL display device of composite structure.

2. Description of Related Art

Conventional liquid crystal display devices have generally used a thin, lightweight and flat display, but since a liquid crystals display device controls transmitted light by changing the orientation of liquid crystals, there is a problem of having a narrow field of view and poor response characteristics. On the other hand, active-matrix organic EL display devices having a wide field of view and good response characteristics have been attracting attention in recent years. Since an organic EL element is a self-luminous element in which a fluorescent material emits light the energy generated in recombination of positive holes injected from an anode and electrons injected from a cathode upon applying an electric field, the organic EL display element is excellent in visibility, and since it uses no backlight light source, it can reduce power consumption and is anticipated as a display device for various devices including portable terminal devices such as a mobile telephone and the like.

In this active-matrix organic EL display device, in order to improve the displaying performance, it is necessary to examine not only the material and structure of an EL element itself but also the characteristics of TFT (Thin Film Transistors) as a switching element, structure of a device, and the like.

In recent years, a polysilicon TFT using a polycrystalline silicon film having high in carrier mobility is often used. In case of using glass, plastic or the like for a substrate, as the process of manufacturing it there is used a low-temperature process of crystallizing an amorphous silicon film at a low temperature of about 300° C. or lower by irradiating laser light, infrared light or the like.

As an active-matrix organic EL display device using a polysilicon TFT manufactured by such a low-temperature process (hereinafter, referred to as a low-temperature polysilicon TFT), there are two types of a structure in which a low-temperature polysilicon TFT and an organic EL element are mounted together on the same substrate (hereinafter, referred to as a mixed-mounting structure) and a structure in which a substrate having a low-temperature polysilicon TFT formed on it (hereinafter, referred to as a TFT circuit forming substrate) and a substrate having an organic EL element formed on it (hereinafter, referred to as an organic EL element forming substrate) are stuck together (hereinafter, referred to as a composite structure). The mixed-mounting structure has an advantage of being capable of reliably and easily realizing an active-matrix organic EL display device by means of a low-temperature polysilicon TFT manufacturing process and an organic EL element manufacturing process which are techniques already established but has a disadvantage that the ratio of the light emitting area of an organic EL element to the area of each picture element (hereinafter, referred to as aperture ratio) is extremely reduced particularly in case that a pixel pitch is made small and a disadvantage that an organic EL layer is influenced by depressed and projected parts of TFT since the surface of the substrate is partitioned into areas having low-temperature polysilicon TFTs formed in them and areas having organic EL elements formed in them. The attempt of compensating for the reduction in aperture ratio by increasing the quantity of emitted light per unit area of an organic EL element leads to induction of disadvantages such as shortening of the life of the organic EL element and reduction in luminous efficiency. The mixed-mounting structure has the disadvantage that it is difficult to form inside it a diffraction grating and the like for efficiently emitting light from an organic EL layer outside the substrate due to its structure.

The composite structure can solve such disadvantages the mixed-mounting structure has. As a first conventional technique for the composite structure, there is a technique of sticking a TFT circuit forming substrate and an organic EL element forming substrate together using indium poles and the like as adhesive, for example, in Japanese Patent Laid-Open Publication No. 2001-117509 (see FIG. 4 of that document). FIG. 1 is a sectional view of an active-matrix organic EL display device according to such a conventional technique. A TFT circuit forming substrate 101 has a TFT 120 formed on it, and its source electrode 125 is electrically connected to an interconnect layer 109. On the other hand, an organic EL element forming substrate 102 has a transparent electrode 110, an organic EL layer 104 and a cathode electrodes 111 partitioned for each picture element formed flatly in this order on it. Both the substrates are stuck together with indium poles 130 as adhesive so that the surface having the TFT 120 formed on it and the substrate having the organic EL layer 104 formed on it face each other. And the indium pole 130 electrically connects the interconnect layer 109 of the TFT circuit forming substrate 101 and the cathode electrode 111 of the organic EL element forming substrate 102 to each other. By this, it is possible to apply a driving voltage for making the organic EL layer 104 emit light to each cathode electrode 111 of the organic EL element forming substrate 102 from the TFT circuit forming substrate 101 side. And ideally it is possible to make the aperture ratio of such an active-matrix organic EL display device close to 100%.

As a second conventional technique for the composite structure, there is a technique of sticking a TFT circuit forming substrate and an organic EL element forming substrate together by connecting a picture element electrode of the TFT circuit forming substrate and a cathode of the organic EL element forming substrate with each other by means of anisotropic conductive paste or an anisotropic conductive film, for example, In Japanese Patent Laid-Open Publication No. 2002-082633 (see FIG. 5 of that document). FIG. 2 is a sectional view of an active-matrix organic EL display device according to such a conventional technique. A TFT circuit forming substrate 201 has a depression formed in it and a microstructure 220 in which a TFT and the like are formed is fitted in this depression, and an interconnect layer 209 is led out through a through hole in a protective insulating thin film 240. An organic EL element forming substrate 202 has an organic EL layer 204 and a cathode electrode 211 stacked almost flatly in each opening formed in an insulating layer 205 on a transparent electrode 210, and the cathode electrode 211 protrudes outside each opening in the insulating layer 205. The TFT circuit forming substrate 201 and the organic EL element forming substrate 202 are stuck together with anisotropic conductive paste or an anisotropic conductive film (none of them is illustrated) so that the interconnect layer 209 and the cathode electrode 211 face each other inward.

Problems the present invention attempts to solve with regard to an organic EL display device of a composite structure are as follows.

A first problem is that an organic EL display device by a conventional composite structure is weak against a pressure from the outside of the device. Since there is an area where an organic EL layer and a connection of a cathode electrode of an organic EL element forming substrate to an interconnect layer of a TFT circuit forming substrate overlap each other in the direction perpendicular to the main surface of both substrates, the display device is liable to be incapable of displaying due to the occurrence of short circuit between a cathode electrode and an anode electrode of the organic EL element forming substrate in case that a pressure is applied to the surface of the display device at the time of a composite process in a manufacturing process or at the time of actually using the display device. This is caused by a fact that an organic EL layer is formed a very thin vapor-deposited film. The thin vapor-deposited film is easily crushed by a force applied from the outside since it is fragile in film quality.

A second problem is that it cannot be easily realized to inexpensively and reliably connect two substrates electrically to each other. Since the respective picture elements must act independently of one another in a display device, a cathode electrode of an organic EL element forming substrate and an interconnect layer of a TFT circuit forming substrate must be secured in electric connection for each picture element. In order to realize this for example by means of indium poles as performed by the first conventional technique of the above-mentioned composite structure, several tens of thousands or more of indium poles of 0.2 mm or less in diameter of cross section must be regularly arranged at intervals of 0.2 mm or less on a flat substrate so that they are in no contact with one another among adjacent picture elements.

SUMMARY OF THE INVENTION

It is therefore an object of the present invention to provide an organic EL display device of a composite structure that resists damage from the pressure with which the component substrates are connected, capable of inexpensively and reliably connecting two substrates electrically to each other.

The present invention provides an organic electroluminescence display device comprises a first substrate including a light emitting area comprising a first electrode, an organic electroluminescence layer and a second electrode stacked one over another and a second substrate including a connection layer for feeding a driving signal to said second electrode, wherein said first substrate has a connection area in which a portion of said second electrode is off set vertically from said light emitting area and connected to said connection layer of said second substrate, and wherein said connection area does not overlie said light emitting area.

since an area where an organic EL layer of an organic EL element forming substrate is formed and a connection area for electrically connecting a cathode electrode of the organic EL element forming substrate and an interconnect layer of a TFT circuit forming substrate to each other are separated from each other and in the connection area a cathode electrode formed on a protruded connection structure protruding from the surface of the organic EL element forming substrate including the organic EL layer formed on it is in contact with the interconnect layer and the vertical projection of the connection area to the surface of a transparent substrate overlaps no light emitting area, it is possible to prevent the organic EL layer from being caused damage a pressure from the outside of the device and thereby realize an organic EL display device being strong against an outside pressure and high in reliability at a good yield rate.

DETAILED DESCRIPTION OF THE REFERRED EMBODIMENTS

Some embodiments of the present invention are described with reference to the drawings. In order to secure the clearness of figures, the following figures show a 2×2 matrix structure of picture elements and the structure of TFT with which a TFT circuit is provided is simplified.

Figure 1:
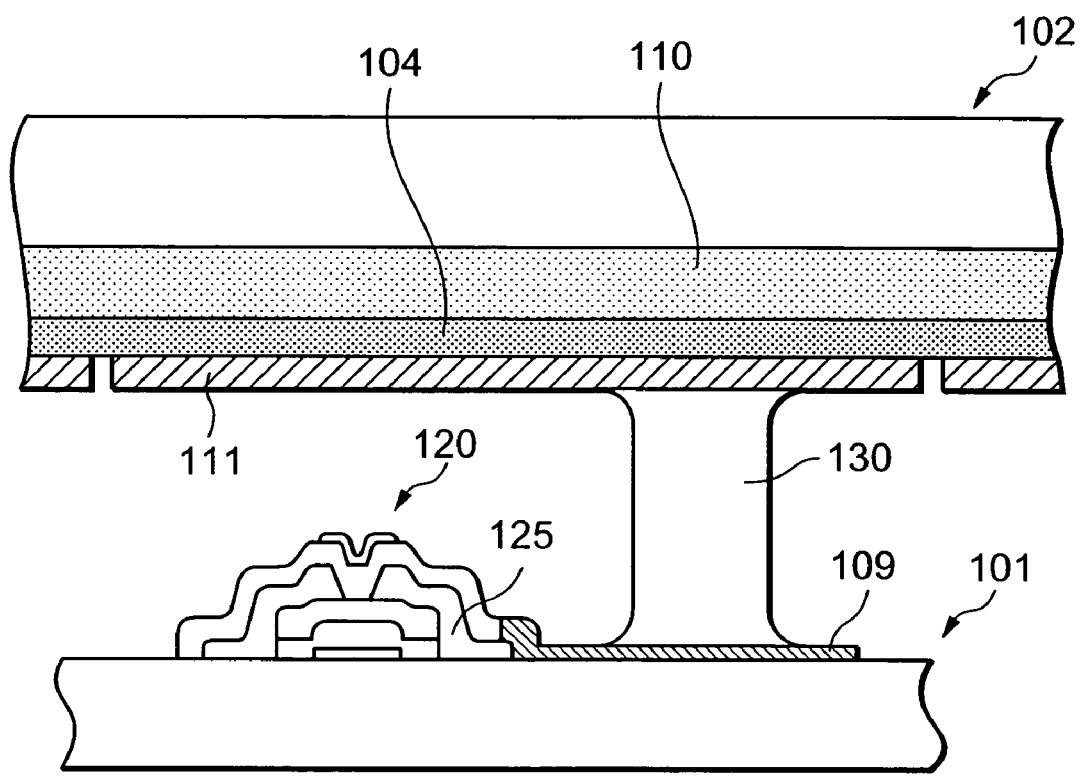
FIG. 1 is a sectional view of an organic EL display device according to a conventional technique.
Figure 2:
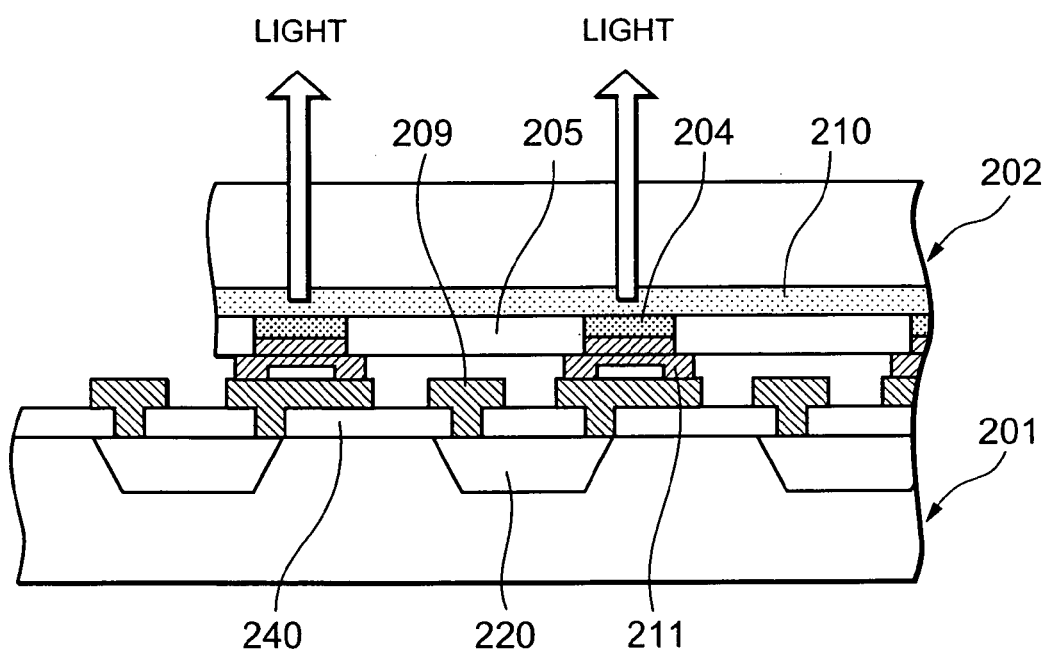
FIG. 2 is a sectional view of an organic EL display device according to another conventional technique.
Figure 3:
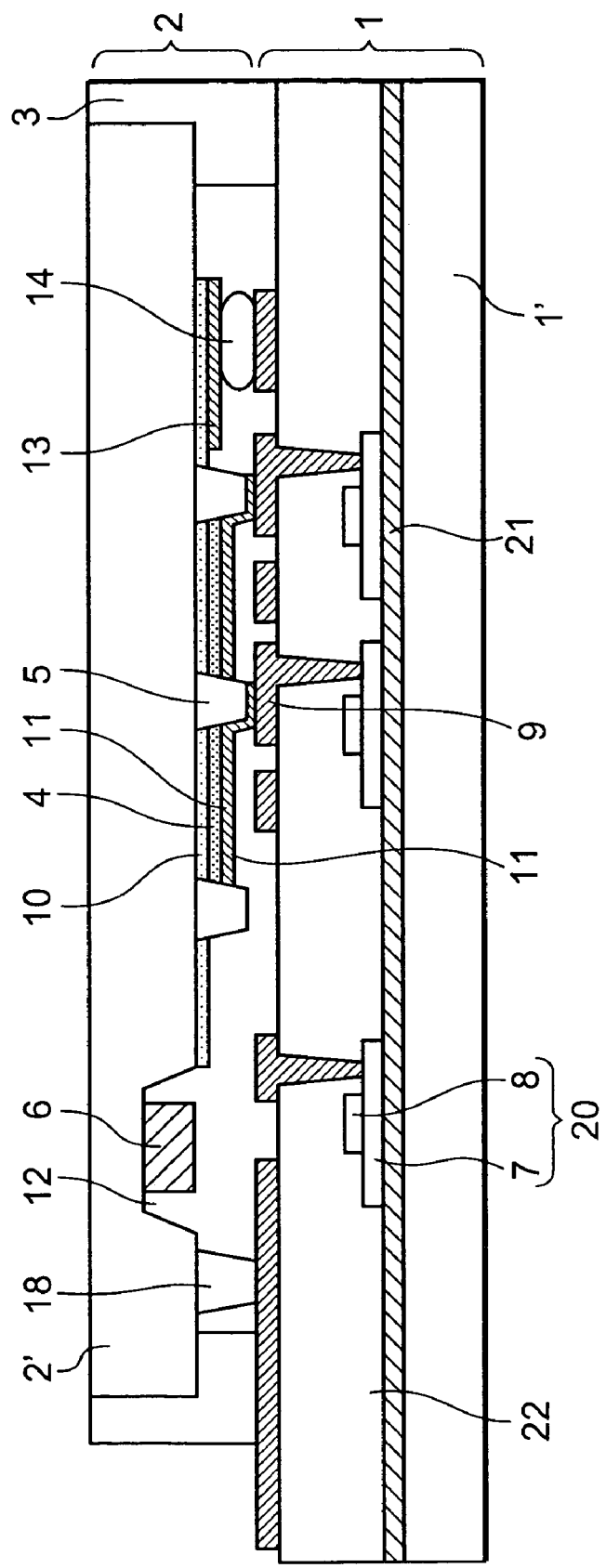
FIG. 3 is a sectional view of an organic EL display device according to the first embodiment of the present invention.

FIG. 3 is a sectional view of an organic EL display device according to a first embodiment of the present invention. As shown in FIG. 3, in an organic EL display device of this embodiment, an organic EL element forming substrate 2 having a light emitting area having a transparent electrode 10, an organic EL layer 4 and a cathode electrode 11 stacked for each picture element on a transparent substrate 2' of glass, plastic or the like and a TFT circuit forming substrate 1 having a TFT 20 forming a picture element circuit for making the organic EL layer 4 emit light, a driving circuit (not illustrated) for driving the TFT 20, an interconnect layer (picture element electrode) 9 led out from the source electrode of the TFT 20 and the like formed on a substrate 1' are sealed by a sealing portion 3 at their circumferential edge portions as keeping a specific interval between them by means of a supporting structure 18. The cathode electrode 11 forms a connection area for being electrically connected to the interconnect layer 9 by extending a part of it to the upper face of a protruded connection structure. The organic EL element forming substrate 2 has a moisture absorbent housing area 12 formed in which a moisture absorbent 6 is housed. The moisture absorbent housing area 12 is formed at a position opposite to a TFT driving circuit of the TFT circuit forming substrate 1. Connection terminals (not illustrated) for inputting a signal for selecting and driving a TFT, an anode voltage to be applied to the transparent electrode 10 of the organic EL element forming substrate 2 and the like are formed on the TFT circuit forming substrate, and an inputted anode voltage is applied to the transparent electrode 10 from a specific electrode of the TFT circuit forming substrate through a bump 14 and an anode connection wiring 13 formed on the organic EL element forming substrate 2.

The TFT circuit forming substrate 1, on which a TFT 20 forming a picture element circuit is formed, can be realized by means of conventional techniques such as a polycrystalline silicon forming technique for micro-crystallizing amorphous silicon by means of a laser annealing method or a lamp annealing method, a film forming, patterning and etching technique utilizing a semiconductor manufacturing technique, and other techniques. Concretely, for example, an undercoating silicon oxide film 21 is formed on such a substrate 1' as a transparent non-alkali glass substrate and the like by means of a CVD process and an amorphous silicon film is formed thereon by a CVD process.

Further, after a polycrystalline silicon forming process using an impurity doping process, a laser annealing process and the like has been performed, by way of an etching process using a photoresist patterned into a desired shape as a mask, polycrystalline silicon 7 is formed in a specific TFT forming area. Next, a gate insulating film (not illustrated) composed of a silicon oxide film for example is formed and then a gate electrode 8 is formed on it by patterning a WSi (tungsten silicide) film for example formed by means of a sputtering method. Next, a TFT 20 is formed by doping an impurity to provide the polysilicon 7 with a conductive type inverse to a conductive type given by an impurity doped in the first impurity doping process, using the gate electrode 8 as a mask. On the TFT 20, an interlayer film 22 made of silicon oxide is formed by means of a CVD method, and contact holes are formed respectively on the gate, source and drain domains of the polysilicon TFT by means of a lithography technique and an etching technique (a contact hole on the source domain only is shown). Further, after a metal interconnect film of aluminum is formed by means of a sputtering method and the like, an interconnect layer is formed by being patterned into a desired shape by means of a lithography technique and an etching technique, and thereby a process of manufacturing a picture element circuit of the TFT circuit forming substrate 1 is completed. A driver circuit for driving a picture element circuit and the like may be manufactured at the same time as the time of manufacturing this picture element circuit.

Figure 4:
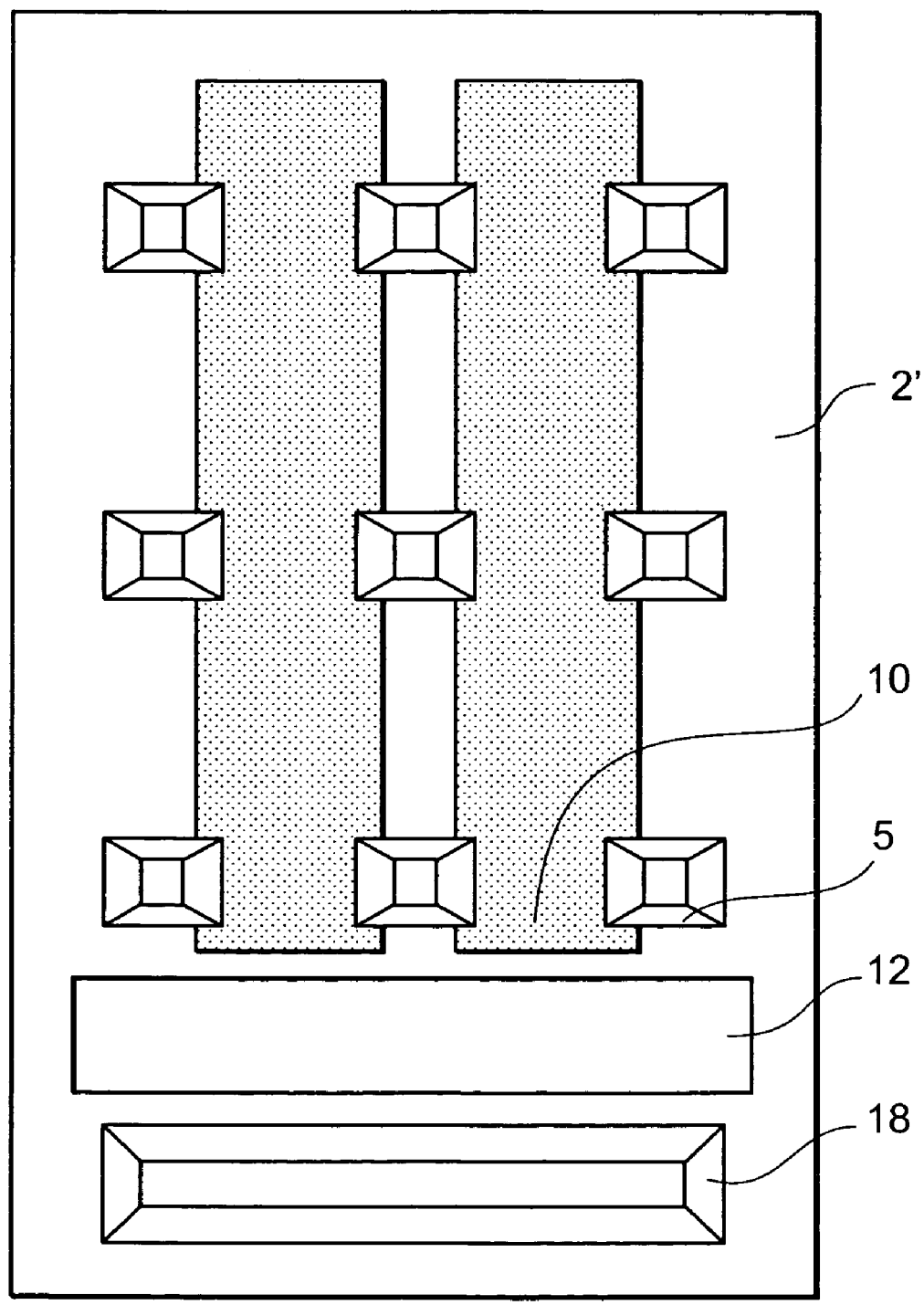
FIG. 4 is a sectional view in a manufacturing process for explaining a manufacturing process of an organic EL element forming substrate of FIG. 3.
Figure 5:
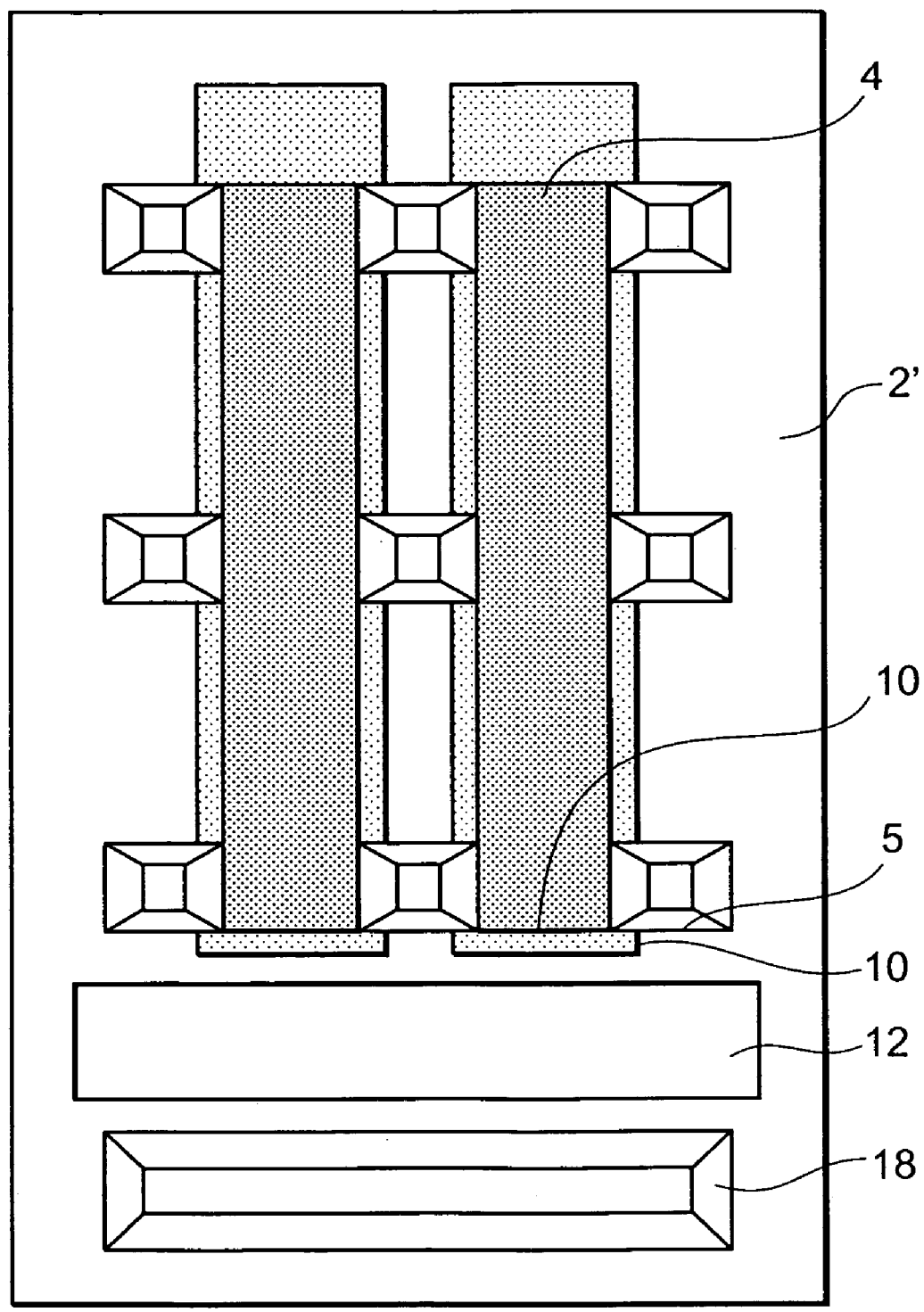
FIG. 5 is a sectional view in a manufacturing process following FIG. 4.
Figure 6:
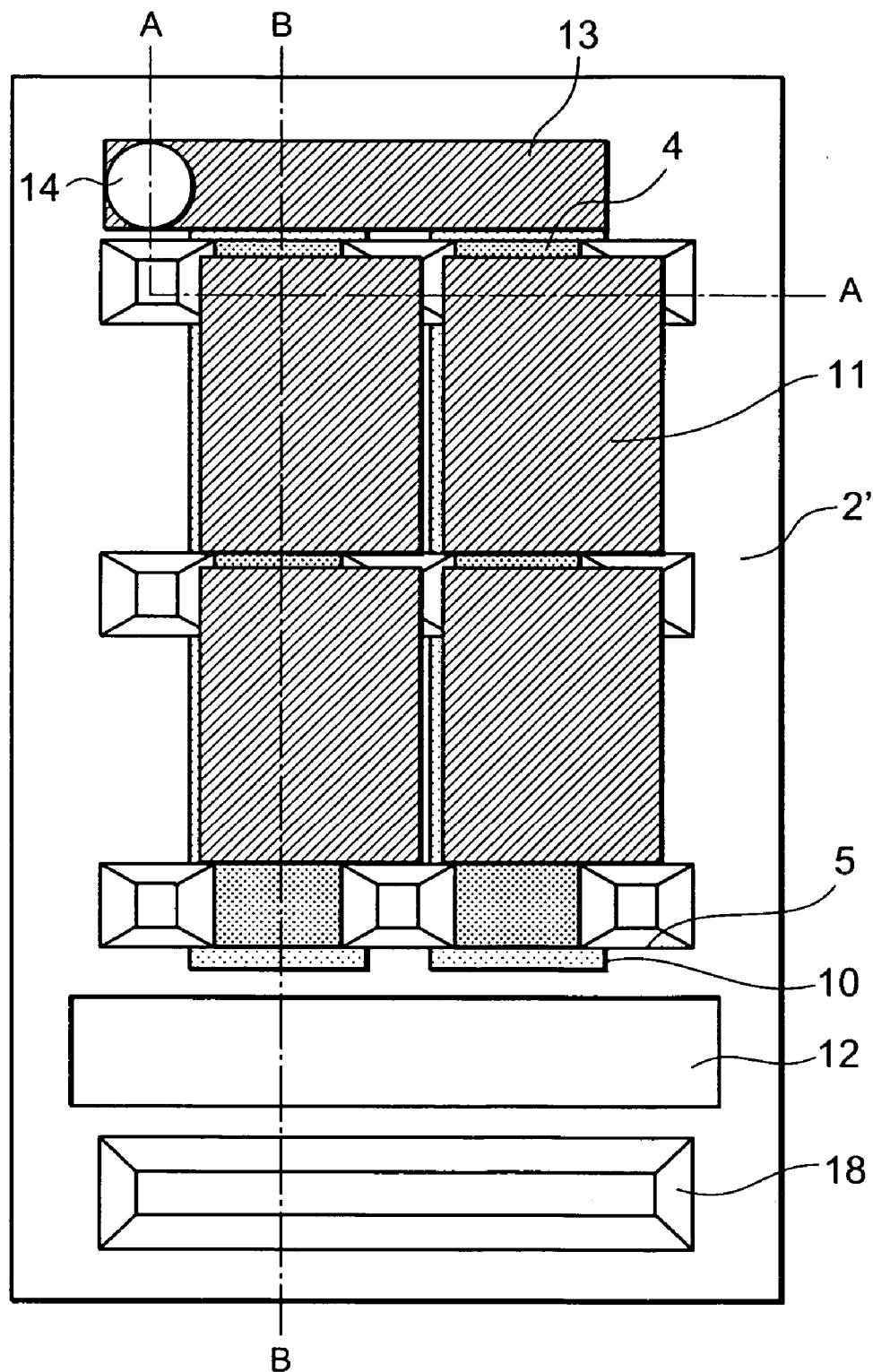
FIG. 6 is a sectional view in a manufacturing process following FIG. 5.

Next, a method of manufacturing an organic EL element forming substrate 2 is described with FIGS. 4 to 6. FIGS. 4 to 6 are plan views arranged in the order of manufacturing processes for explaining a method for manufacturing an organic EL element forming substrate according to this embodiment. In FIGS. 4 to 6, parts equivalent to those of FIG. 3 are given the same reference symbols and repetitive descriptions are properly omitted. First, there is prepared a non-alkali glass substrate used in a TFT circuit forming substrate 1 or a transparent substrate equivalent to it in which a moisture absorbent housing area 12 for housing a moisture absorbent 6 is formed in advance by means of an etching method and the like.

After a transparent conductive film of ITO or the like is formed on this transparent substrate 2' by a sputtering method and the like, patterning is performed by a lithography technique and an etching technique publicly known, and thereby a transparent electrode 10 of a desired shape is formed in a picture element area to have picture elements formed in the shape of a matrix. Next, a protruded connection structure 5 is formed on the transparent substrate 2' so as to put a part of the transparent electrode 10 between it and the transparent electrode 2'. And at the same time a supporting structure 18 is formed at an edge portion of the transparent substrate 2' (FIG. 4).

In this process, after a silicon oxide film is formed all over the surface of the substrate by means of a sputtering method or a CVD method, a photoresist patterned into a desired shape is formed thereon and the silicon oxide film is etched by means of a wet etching method, a dry etching method or the combination of both methods using the photoresist as a mask, and thereby these structures can be realized. Or these structures may also be realized by using a method of forming a photosensitive resin having a desired pattern on a substrate having a transparent electrode 10 formed on it and bake-hardening this photosensitive resin by heating it in a high-temperature inert gas environment of about 200° C. And as shown in FIG. 3, at least one of sides of the protruded connection structure 5 in the lateral direction of the page is formed so as to be inclined to the inside of the protruded structure 5 as being more distant from the surface of the transparent substrate 2'. This can be realized by controlling the etching conditions or reducing more the transmittance of the circumferential portions of a light transmitting area of a mask used in patterning the photosensitive resin as being more distant from the center of the light transmitting area.

After this, a hole injection layer, a hole transport layer, a light emitting layer, an electron transport layer and the like, which are publicly known as a component of an organic EL element structure, are formed in the order according to necessity and an organic EL layer 4 is formed so as to connect between protruded structures 5 adjacent to each other in the lateral direction of the page (FIG. 5). This organic EL layer 4 is not limited to said layer structure but may be a single light emitting layer structure for example. And in order to realize an organic EL device having a full-color display, said light emitting layer is formed so as to make each picture element emit a different color light by using three kinds of organic EL light emitting materials corresponding to the three primary colors.

Next, a cathode electrode 11 composed of lithium (Li) or a Li compound and aluminum (Al) is formed for each picture element by means of a vapor deposition technique (FIG. 6) As shown in FIG. 6, the cathode electrode 11 is independently formed on the organic EL layer 4 for each picture element and extends so as to cover the upper flat part of one (right side one in FIG. 6) of both protruded connection structures 5 adjacent to each other in the lateral direction of the page.

At this time the cathode electrode 11 extends from a light emitting area to a connection area so as to pass an inclined side face of the protruded connection structure 5. This has a function of improving the cathode electrode 11 in uniformity of film leading to the protruded connection structure 5 and at the same time, has a function of separating the light emitting area and the connection area from each other in the lateral direction of the page. The cathode electrode 11 not only acts as a cathode but also has a role as the wiring for connecting electrically to an interconnect layer of the TFT circuit forming substrate on the protruded connection structure 5.

Figure 7A:
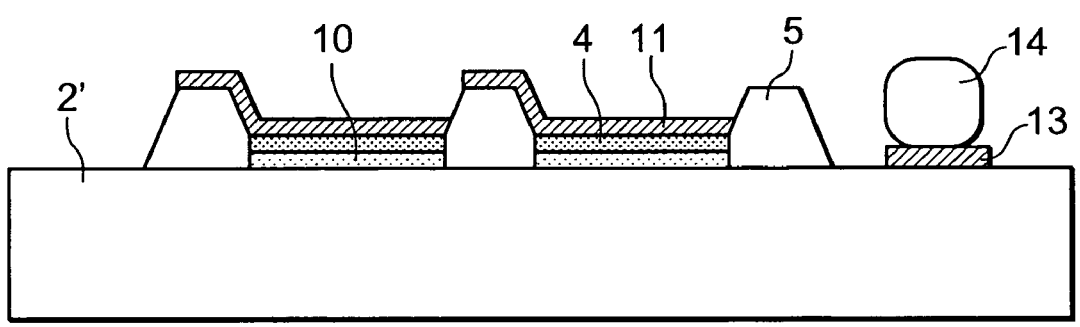
FIG. 7(a) is sectional views taken along line A—A of FIG. 6
Figure 7B:
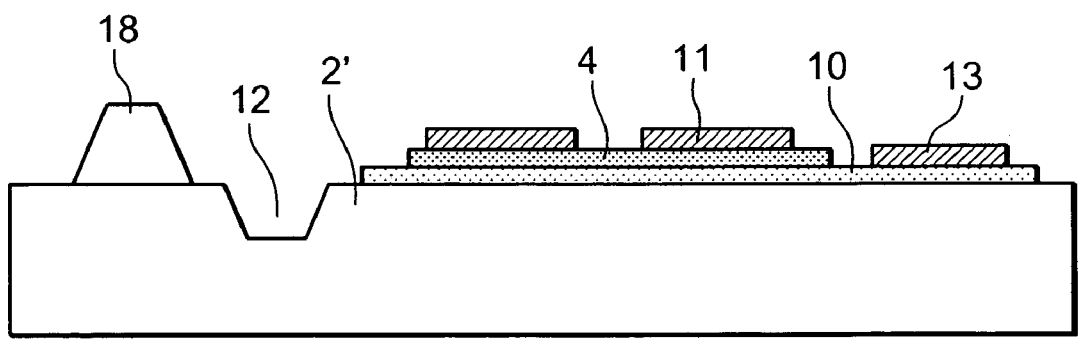
FIG. 7(b) is sectional views taken along line B—B of FIG. 6.
Figure 8:
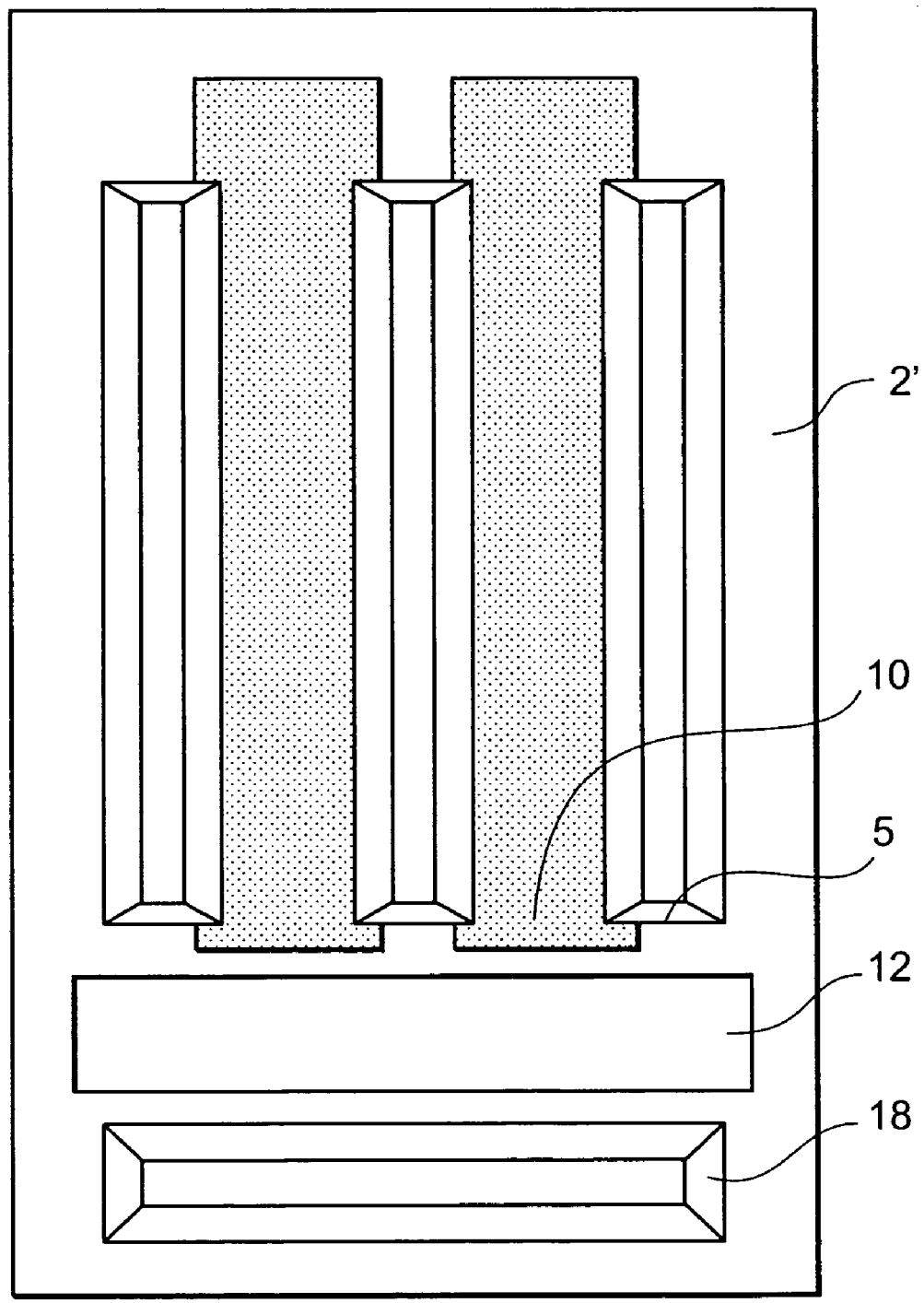
FIG. 8 is another sectional view in the manufacturing process of FIG. 4.

In a process of forming a cathode electrode 11, at the same time an anode connection wiring 13 is formed the same material as the cathode electrode 11. The anode connection wiring 13 forms an electric connection making it possible to apply the same anode voltage to all of plural transparent electrodes 10 arranged in the lateral direction of the page, as shown in FIG. 6. Further, in order to electrically connect the anode connection wiring 13 and a specific electrode of the TFT circuit forming substrate 1 to each other, a bump 14 formed silver (Ag) for example is formed on the anode connection wiring 13. FIG. 7 shows sectional views taken along ling A—A of FIG. 6(a) and line B—B of FIG. 6(b). In FIG. 7, the same reference symbols are given to components equivalent to those of FIG. 6.

An organic EL display device shown in FIG. 3 is completed by completing a manufacturing process of this embodiment through sealing the outer circumferential edges of a TFT circuit forming substrate 1 and an organic EL element forming substrate 2 which have been formed by the above-mentioned processes with sealing portions 3 of an ultraviolet-hardening resin in a state where the TFT forming surface and the organic EL layer forming surface are opposite to each other. As shown in FIG. 3, the height of a protruded connection structure 5 from the surface of a transparent substrate 2' is higher than the height of a cathode electrode 11 in a light emitting area from the surface of the transparent substrate 2'. And in a connection area where an electric connection with an interconnect layer 9 is performed, the cathode electrode formed on the upper surface of a protruded connection structure 5 protruding from the surface of the organic EL element forming substrate 2 is in contact with the interconnect layer 9. Therefore, even if the TFT circuit forming substrate 1 is deformed so as to be close to the organic EL element forming substrate 2 by being subjected to a pressure from the outside, an organic EL layer suffers no damage caused by coming into contact with the TFT forming substrate opposite to it. And a light emitting area in which an organic EL layer 4 is formed and a connection area for performing an electric connection to an interconnect layer 9 of the TFT circuit forming substrate 1 are separated from each other in a picture element.

And since the side face having a cathode electrode 11 of a protruded connection structure 5 formed on it is formed so as to be inclined toward the inside of the protruded connection structure 5 as being more distant from the surface of the transparent substrate 2', the vertical projection of a connection area to the surface of the transparent substrate 2' does not overlap a light emitting area. Therefore, a pressure from the outside reaches no organic EL layer. Because of the above-mentioned matters, an organic EL display device of this embodiment has a feature of being strong against a pressure from the outside.

Further, the sealing process is performed so that the space hermetically sealed between both substrates is filled up with a depressurized inert gas. This sealed space pressure is made to be a pressure being always lower than atmospheric pressure when an organic EL display device operates in user's ordinary living environment. Concretely, the sealed space pressure is made to be equal to or lower than 0.7 atmosphere (=710 hPa). The said display device is kept in a state where the surfaces of it are uniformly pressed down by the atmospheric pressure due to the difference in pressure between the atmospheric pressure and the sealed space pressure. Because of this, a cathode electrode 11 formed on a protruded connection structure 5 of an organic EL element forming substrate 2 for each picture element and an interconnect layer 9 of a TFT circuit forming substrate 1 are kept electrically connected well to each other.

The protruded connection structure 5 does not need to be partitioned for each picture element as shown in FIG. 4 but may be formed in the shape of a straight line in the vertical direction of the page. Or it may be formed in the shape of a straight line in the lateral direction of the page or may be formed in the shape of a lattice. And in the above description a moisture absorbent housing area 12 for housing a moisture absorbent 6 is formed in advance in a transparent substrate 2' prior to manufacturing an organic EL display device of this embodiment, but may be formed between any above-mentioned processes for forming an organic EL layer 4.

And since an organic EL display device according to an embodiment of the present invention is composed so that its inner pressure is a negative pressure relative to atmospheric pressure in all operating states and environments, a uniform pressure is applied to the whole device and this enables a cathode of an organic EL element forming substrate and an interconnect layer of a TFT circuit forming substrate which have a high reliability for each picture element to be electrically connected to each other.

And since an organic EL display device of the present invention is provided with a moisture absorbent housing area and further provided with a groove along the circumference of the substrate, it is possible to keep the sealed space low in humidity in an organic EL display device of a composite structure, further enlarge the sealed space in area, keep the inside of the device low in humidity and uniformly spread the moisture absorbing effect of a moisture absorbent all over the inside of the device, and thereby prevent the organic EL display device from being deteriorated in characteristics by humidity.

And since an organic EL display device according to an embodiment of the invention is provided with a high-efficiency light emitting structure, it is possible to realize a high-efficiency organic EL display device.

Figure 9:
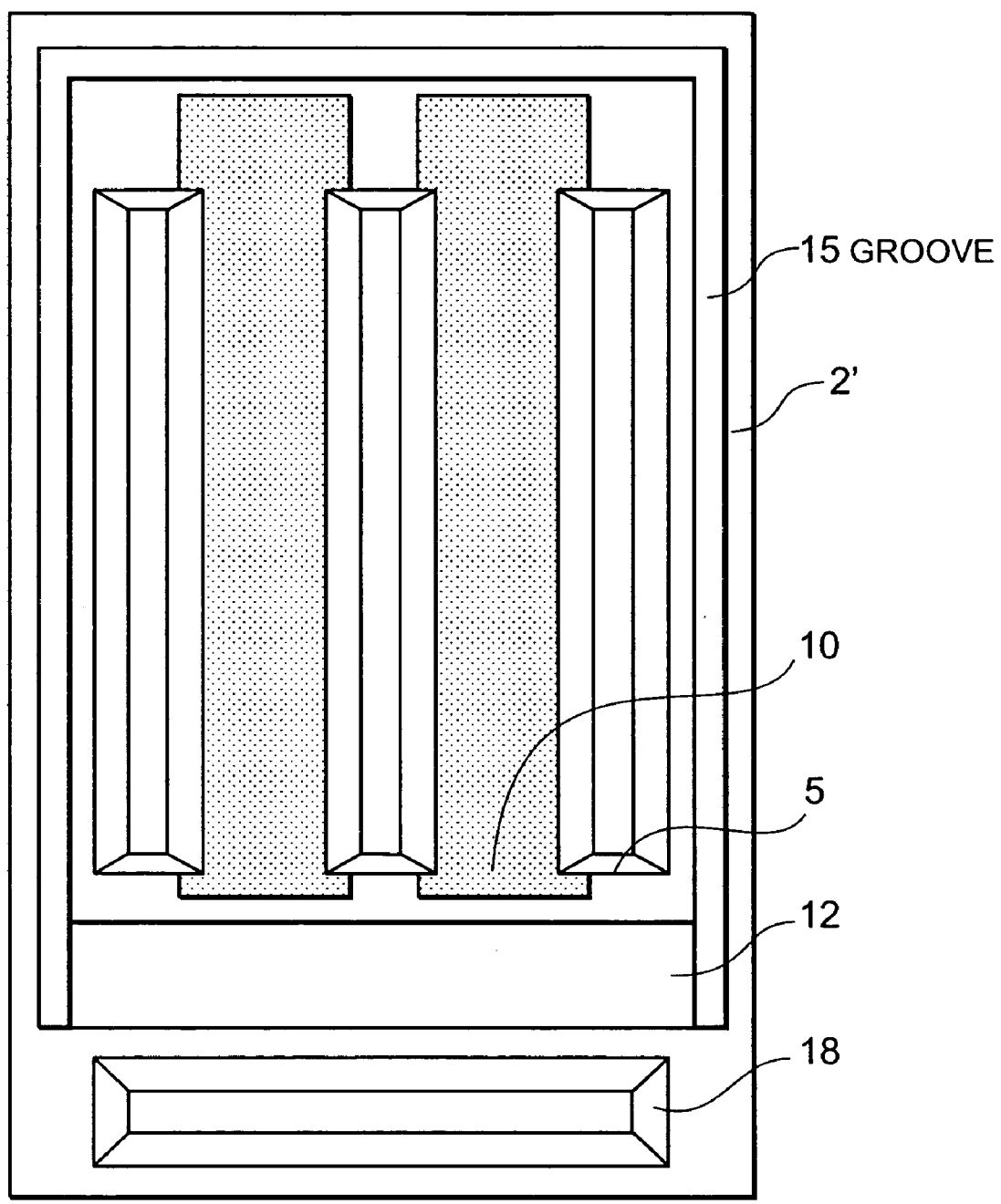
FIG. 9 is a sectional view in a manufacturing process for explaining a manufacturing process of an organic EL element forming substrate according to the second embodiment of the present invention.
Figure 10:
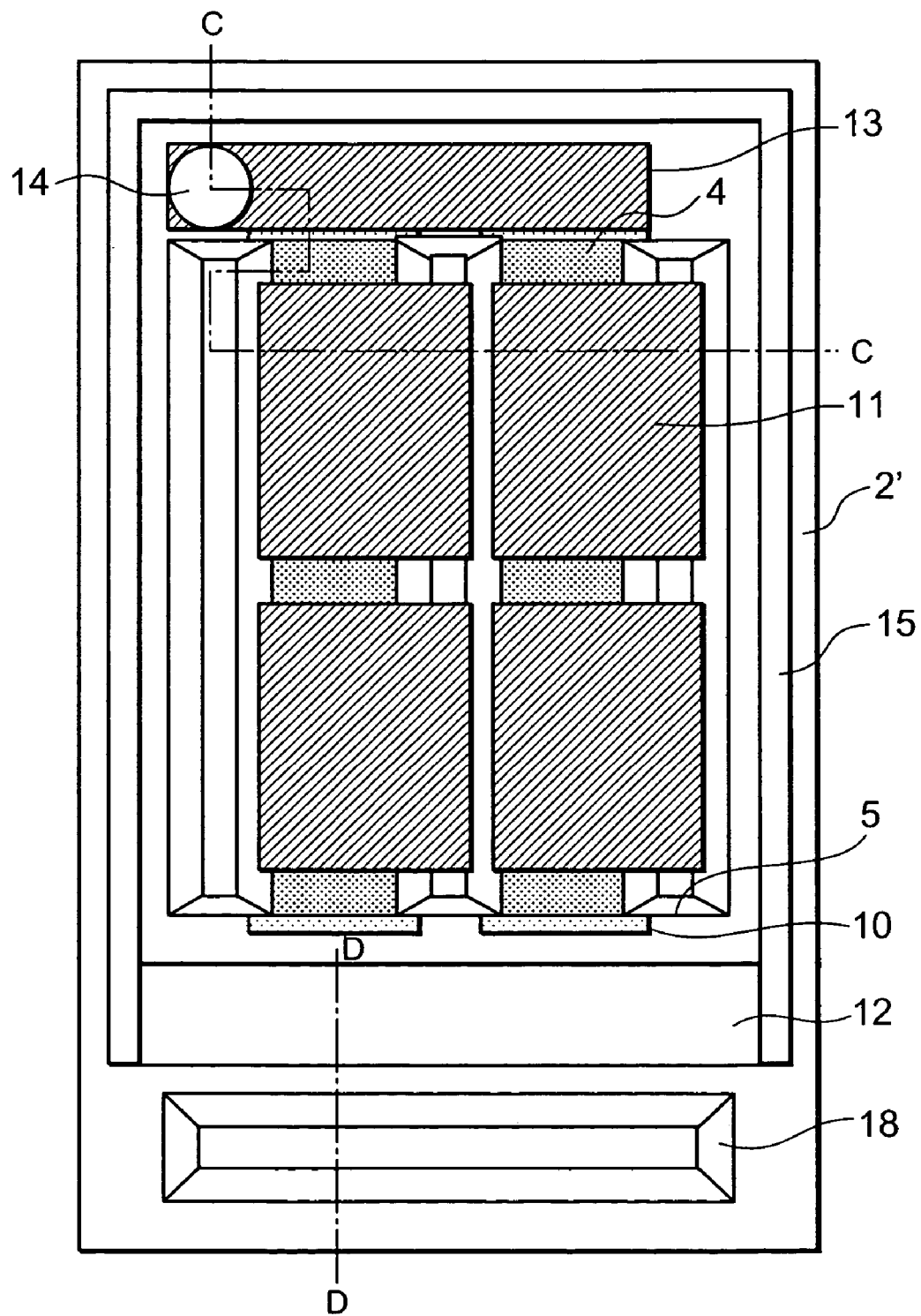
FIG. 10 is a sectional view in a manufacturing process following FIG. 9.
Figure 11A:
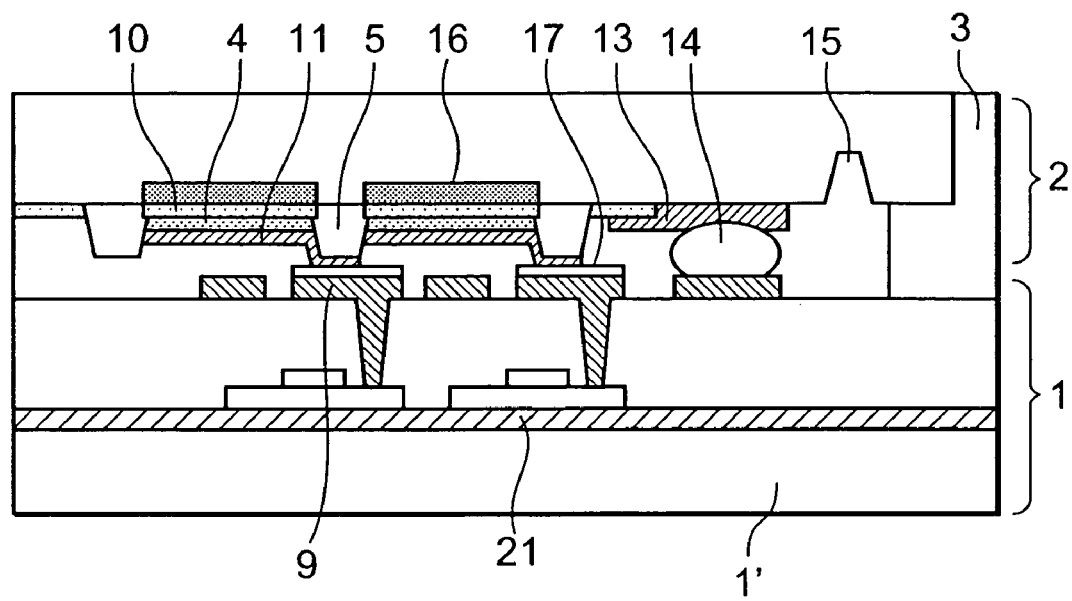
FIG. 11(a) is sectional views taken along line C—C of FIG. 10
Figure 11B:
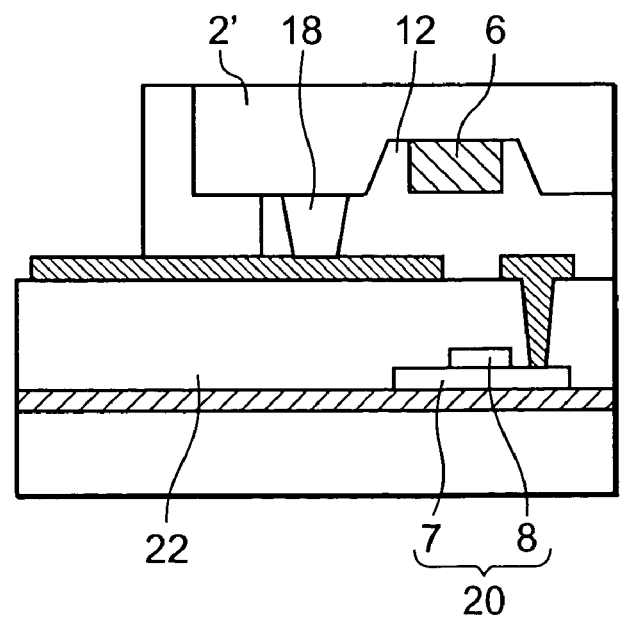
FIG. 11(b) is sectional views taken along line D—D of FIG. 10.

FIGS. 9 and 10 are plan views in the order of manufacturing processes for explaining an organic EL element forming substrate according to a second embodiment of the present invention. FIG. 11(a) shows sectional views taken along line C—C of FIG. 10 and FIG. 11(b) shows sectional views taken along line D—D of FIG. 10.

In FIGS. 9 to 11, components equivalent to those of FIGS. 3 to 6 are given the same reference symbols and repetitive description of them is properly omitted. This embodiment is different from the first embodiment shown in FIGS. 1 to 4 in that an organic EL element forming substrate 2 is provided with a groove 15 formed from both ends of a moisture absorbent housing area 12 along the circumference of a transparent substrate 2' and a diffraction grating 16 formed between a transparent electrode 10 and the transparent substrate 2', and in that a cathode electrode 11 of the organic EL element forming substrate 2 and an interconnect layer 9 of a TFT circuit forming substrate 1 are stuck together with an adhesive layer 17.

The groove 15 is formed at the same time as the time of forming the moisture absorbent housing area 12. The sealed gas space of an organic EL display device is made large by providing the groove 15. In case that the invasion of moisture from a sealing portion at the circumference of the substrates and/or the discharge of adsorbed moisture from the surface of the substrate has occurred, the same absolute quantity of moisture makes a larger sealed gas space lower in water vapor pressure.

Therefore, the groove 15 has an effect of preventing deterioration in characteristics of an EL organic layer to be caused by moisture. The groove 15 has a function of spreading the moisture absorbing effect of the moisture absorbent 9 more uniformly all over the sealed gas space. Due to this, only by disposing a moisture absorbent at a single spot in an organic EL display device, for example, at a position opposite to an area in which the driving circuit of a TFT circuit forming substrate 2 is formed, it is possible to sufficiently spread its moisture absorbing effect all over the sealed gas space, and this contributes to miniaturization of the device.

The diffraction grating 16 has an effect of improving the ratio of the quantity of light emitted outside the substrate to the quantity of light emitted from a transparent electrode 10. This diffraction grating 16 is realized by the following processes for example.

First, photoresist is applied to a transparent substrate 2' and a stripes-shaped or islands-shaped pattern of several hundreds nanometers in pitch is formed by means of an interference fringe by the optical path difference between laser light beams divided by a half-mirror or the like. After this, the transparent substrate 2' is etched into a desired pattern by means of a dry etching technique using this patterned photoresist as a mask. Next, after the photoresist is removed, a material being high in refractive index such as silicon nitride or the like, for example, is formed into a film on the transparent substrate 2' by means of a film forming technique such as a CVD method or the like. Further, the surface of the transparent substrate 2' is flattened by etching back the surface of the silicon nitride film or mechanically polishing the surface of the silicon nitride film and then the said diffraction grating 16 is formed on the surface of the transparent substrate 2'.

The manufacturing process of an organic EL element forming substrate according to this embodiment after the diffraction grating has been formed is the same as the manufacturing process of the first embodiment of FIGS. 4 to 6.

That is to say, after a transparent electrode 10 and a protruded connection structure 5 are formed on the transparent substrate 2' (FIG. 9), an organic EL layer 4, a cathode electrode 11, an anode connection wiring 13 and the like are formed and a bump 14 is disposed (FIG. 10), and thus the manufacturing process of an organic EL element forming substrate according to this embodiment is completed.

A manufacturing process of a TFT circuit forming substrate according to this embodiment is entirely the same as the manufacturing process of a TFT circuit forming substrate according to the first embodiment.

A sealing process in this embodiment is performed while introducing an inert gas between a TFT circuit forming substrate 1 and an organic EL element forming substrate 2 in an atmospheric pressure environment, said substrates 1 and 2 being provided with a conductive adhesive layer such as an anisotropic conductive film or the like for example between them. Because of sticking and electrically connecting together a cathode electrode 11 on a protruded connection structure 5 of the organic EL element forming substrate 2 and an interconnect layer 9 of the TFT circuit forming substrate 1 with an adhesive layer 17, it is possible to keep the sealed space of an organic EL display device at an atmospheric pressure and perform a sealing, operation under the atmospheric pressure environment.

According to the above, an organic EL display device according to this embodiment of FIG. 11 is realized. Since an organic EL display device of this embodiment makes it more difficult for the space between the substrates to rise in humidity because of having a groove 15 in comparison with an organic EL display device of the first embodiment of FIG. 3, it is possible to prevent an organic EL layer from deterioration caused by moisture and thereby realize an organic EL display device of long life and high reliability.

A structure for efficiently emitting light from an organic EL layer outside the substrate (high-efficiency light emitting structure) is not limited to a diffraction grating as described above but may be a scattering layer utilizing diffuse reflection of a fine rugged surface or a low-refractive index layer having a lower refractive index than a transparent substrate 2' of porous silica (silicon oxide) or the like, for example.

In the above, although this present invention has been described on the basis of its preferred embodiments, an organic EL display device of the present invention is not limited to the above-mentioned embodiments, but organic EL display devices, which are variously modified without changing the purport of the present invention, fall also within the scope of the present invention. For example, an organic EL display device of this application is not limited to a liquid crystal display device of an active-matrix type but may be an organic EL display device of a static driving type and the like.

What is claimed is:

1. An organic electroluminescence display device comprising:
    a first substrate including a light emitting area comprising a first electrode, an organic electroluminescence layer and a second electrode stacked one over another and a second substrate including a connection layer for feeding a driving signal to said second electrode,
    wherein said first substrate has a connection area in which a portion of said second electrode is off set vertically from said light emitting area and connected to said connection layer of said second substrate, and
    wherein said connection area does not overlie said light emitting area.

2. An organic electroluminescence display device according to claim 1,
    wherein said connection area has a projection including a slope.

3. An organic electroluminescence display device according to claim 1,
    wherein said first substrate has a depression for housing a moisture absorbent.

4. An organic electroluminescence display device according to claim 3,
    wherein said depression forming opposite to an area in which said driving circuit of said second substrate.

5. An organic electroluminescence display device according to claim 3,
    wherein a groove extending from said depression along the circumferential edge portions of said first substrate.

6. An organic electroluminescence display device according to claim 3,
    wherein a groove extending from said depression along the circumferential edge portions of said first substrate.

7. An organic electroluminescence display device according to claim 1,
    wherein a gas space between said first substrate and said second substrate is filled up with an inert gas of 710 hPa or lower in pressure.

8. An organic electroluminescence display device according to claim 1, wherein said connection area of said first substrate and said connection area of said second substrate are stuck together with an adhesive layer.

9. An organic electroluminescence display device according to one of claim 1,
wherein a diffraction grating, a low-refractive index layer having a refractive index lower than said first substrate, or a light scattering layer for scattering light is formed on the surface of said first substrate being in contact with said, transparent electrode.

10. An organic electroluminescence display device according to claim 1,
wherein said light emitting area is formed two-dimensionally in the shape of a matrix.

* * * * *